United States Patent
Daryanani et al.

(10) Patent No.: US 10,861,550 B1
(45) Date of Patent: Dec. 8, 2020

(54) FLASH MEMORY CELL ADAPTED FOR LOW VOLTAGE AND/OR NON-VOLATILE PERFORMANCE

(71) Applicant: Microchip Technology Incorporated, Chandler, AZ (US)

(72) Inventors: Sonu Daryanani, Tempe, AZ (US); Bomy Chen, Newark, CA (US); Matthew Martin, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/540,170

(22) Filed: Aug. 14, 2019

Related U.S. Application Data

(60) Provisional application No. 62/858,088, filed on Jun. 6, 2019.

(51) Int. Cl.
*G11C 11/34* (2006.01)
*G11C 7/00* (2006.01)
(Continued)

(52) U.S. Cl.
CPC .......... *G11C 16/0408* (2013.01); *G11C 16/08* (2013.01); *G11C 16/10* (2013.01);
(Continued)

(58) Field of Classification Search
CPC ..... G11C 16/0408; G11C 16/08; G11C 16/10; G11C 16/14; G11C 16/3418; H01L 29/42328
(Continued)

(56) References Cited

U.S. PATENT DOCUMENTS 6,101,131 A * 8/2000 Chang ................ G11C 16/0416
257/E21.689
6,141,242 A * 10/2000 Hsu ........................ G11C 11/005
365/182
(Continued)

OTHER PUBLICATIONS

"SuperFlash Memory Products: High Performance, Low Power Consumption and Superior Reliability," Microchip Technology Incorporated, URL:http://ww1.microchip.com/downloads/en/DeviceDoc/25072C.pdf, 2 pages, Sep. 20, 2012.
(Continued)

*Primary Examiner* — Viet Q Nguyen
(74) *Attorney, Agent, or Firm* — Slayden Grubert Beard PLLC

(57) ABSTRACT

A memory cell having a structure of a modified flash memory cell, but configured to operate in a low voltage domain (e.g., using voltages of ≤6V amplitude for program and/or erase operations) is provided. The disclosed memory cells may be formed with dielectric layers having reduced thickness(es) as compared with conventional flash memory cells, which allows for such low voltage operation. The disclosed memory cells may be compatible with advanced, high density, low energy data computational applications. The disclosed memory cells may replace or reduce the need for RAM (e.g., SRAM or DRAM) in a conventional device, e.g., microcontroller or computer, and are thus referred to "RAM Flash" memory cells. Data retention of RAM Flash memory cells may be increased (e.g., to days, months, or years) by (a) applying a static holding voltage at selected nodes of the cell, and/or (b) periodically refreshing data stored in RAM Flash.

20 Claims, 4 Drawing Sheets

(51) Int. Cl.
*G11C 16/04* (2006.01)
*H01L 29/423* (2006.01)
*G11C 16/08* (2006.01)
*G11C 16/34* (2006.01)
*G11C 16/14* (2006.01)
*G11C 16/10* (2006.01)

(52) U.S. Cl.
CPC .......... *G11C 16/14* (2013.01); *G11C 16/3418* (2013.01); *H01L 29/42328* (2013.01)

(58) Field of Classification Search
USPC .................................................... 365/185.29
See application file for complete search history.

(56) References Cited

U.S. PATENT DOCUMENTS

| | | | | | |
|---|---|---|---|---|---|
| 6,222,761 | B1 * | 4/2001 | Gerber | .................. | G11C 16/10 |
| | | | | | 365/185.02 |
| 6,272,050 | B1 * | 8/2001 | Cunningham | ..... | G11C 16/0425 |
| | | | | | 365/185.28 |
| 6,424,011 | B1 * | 7/2002 | Assaderaghi | ......... | G11C 11/005 |
| | | | | | 257/350 |
| 6,653,682 | B1 * | 11/2003 | Houdt | ................ | G11C 16/0425 |
| | | | | | 257/315 |
| 6,660,588 | B1 * | 12/2003 | Yang | .................... | H01L 27/115 |
| | | | | | 438/257 |
| 6,754,108 | B2 * | 6/2004 | Forbes | .................. | G11C 11/404 |
| | | | | | 257/E29.129 |
| 7,045,848 | B2 * | 5/2006 | Shukuri | ................. | B82Y 10/00 |
| | | | | | 257/311 |
| 7,057,230 | B2 * | 6/2006 | Tanaka | .............. | H01L 29/40114 |
| | | | | | 257/315 |
| 7,221,586 | B2 * | 5/2007 | Forbes | ................ | G11C 11/5671 |
| | | | | | 257/E27.103 |
| 7,345,915 | B2 * | 3/2008 | Benjamin | .......... | G11C 16/0433 |
| | | | | | 365/185.14 |
| 7,400,012 | B2 * | 7/2008 | Bhattacharyya | ....... | B82Y 10/00 |
| | | | | | 257/324 |
| 7,446,368 | B2 * | 11/2008 | Eldridge | ............... | H01L 27/115 |
| | | | | | 257/314 |
| 7,796,442 | B2 * | 9/2010 | Katada | ............. | H01L 29/42324 |
| | | | | | 365/185.29 |
| 7,903,465 | B2 * | 3/2011 | Haggag | ................ | G11C 16/0433 |
| | | | | | 365/185.05 |
| 8,809,930 | B2 * | 8/2014 | Jeon | .................... | H01L 29/7831 |
| | | | | | 257/314 |
| 8,890,230 | B2 * | 11/2014 | Hsu | .................. | H01L 27/11521 |
| | | | | | 257/315 |
| 9,305,650 | B2 * | 4/2016 | Gopalakrishnan | .......................... | |
| | | | | | H01L 29/7841 |
| 9,306,055 | B2 * | 4/2016 | Chen | ............... | G11C 16/0408 |
| 9,406,687 | B1 * | 8/2016 | Yang | ................ | H01L 27/11524 |
| 9,425,055 | B2 * | 8/2016 | Winstead | .......... | H01L 29/42328 |
| 9,455,037 | B2 * | 9/2016 | Hewitt | ............... | G11C 16/0416 |
| 9,728,544 | B2 * | 8/2017 | Yu | ..................... | H01L 27/11536 |
| 9,761,596 | B2 * | 9/2017 | Cheng | ............... | H01L 27/11521 |
| 10,014,380 | B2 * | 7/2018 | Fang | ...................... | H01L 28/00 |
| 10,128,259 | B1 * | 11/2018 | Yang | ................ | H01L 27/11568 |
| 10,276,587 | B2 * | 4/2019 | Wu | .................... | H01L 27/11573 |
| 10,347,728 | B1 * | 7/2019 | Hymas | .............. | H01L 29/42328 |
| 10,347,773 | B2 * | 7/2019 | Si | ....................... | G11C 16/0416 |
| 10,374,067 | B2 * | 8/2019 | Levy | .................... | G11C 16/10 |
| 10,446,569 | B2 * | 10/2019 | Ogata | ............... | H01L 29/42344 |
| 10,546,947 | B2 * | 1/2020 | Hymas | .............. | H01L 29/42328 |
| 10,580,781 | B2 * | 3/2020 | Tan | ...................... | H01L 29/0847 |
| 2001/0028578 | A1 * | 10/2001 | Cunningham | ........ | H01L 27/115 |
| | | | | | 365/185.28 |
| 2002/0145914 | A1 | 10/2002 | Ogura et al. | ............. | 365/185.28 |
| 2005/0179079 | A1 | 8/2005 | Wu | ..................... | 257/316 |
| 2008/0111181 | A1 * | 5/2008 | Park | .................. | H01L 29/66825 |
| | | | | | 257/319 |
| 2011/0107014 | A1 | 5/2011 | Ruby et al. | .................... | 711/103 |

OTHER PUBLICATIONS

International Search Report and Written Opinion, Application No. PCT/US2019/052835, 16 pages, dated Jan. 30, 2020.

* cited by examiner

FLASH MEMORY CELL ADAPTED FOR LOW VOLTAGE AND/OR NON-VOLATILE PERFORMANCE

RELATED APPLICATION

This application claims priority to commonly owned U.S. Provisional Patent Application No. 62/858,088 filed Jun. 6, 2019, the entire contents of which are hereby incorporated by reference for all purposes.

TECHNICAL FIELD

The present disclosure relates to integrated circuit memory devices, and more particularly to modified flash memory adapted for low-voltage and/or non-volatile performance.

BACKGROUND

Microcontroller and other computer systems may include any one or more types of memory to meet various objectives, such as a target data processing speed, data retention, or cost, depending on the intended user or application of the respective computer system.

Different types of memory vary in a number of different characteristics, such as speed (e.g., as measured by the time required for a central processing unit (CPU) to access stored data), data storage size, data retention (e.g., volatile or non-volatile), endurance (e.g., a number of program/erase cycles after which the memory may become degraded or unreliable), power consumption, physical size, and cost, for example.

Volatile memory refers to memory that stores data only as long as it remains connected to a power supply. Examples of volatile memory include various types of random access memory (RAM), such as static RAM (SRAM) and Dynamic RAM (DRAM). Non-volatile memory refers to memory that can store data even when disconnected from a power supply. Example types of non-volatile memory include hard drives, flash memory, and EEPROM. FIG. 1 shows an example taxonomy of various types of conventional volatile and non-volatile memory.

Certain advanced process technology systems have strict design and performance requirements regarding the memory included in such systems. For example, advanced process technology systems typically require a very tight metal pitch and can only tolerate low voltages at minimum design rules. As used herein, "metal pitch" refers to the distance between two adjacent metal lines, including the width of the two metal lines. In addition, some systems use aluminum metallization, typically requiring very low energy, highly parallel design and fast data transfers.

Modern advanced systems often incorporate flash, SRAM, and/or DRAM memory devices. Conventional flash memory cells are typically small (e.g., 1 transistor (1T) or 1.5 transistors (1.5)) and provide high data retention (e.g., >10 years), but require high voltages (typically >10V) and have slow data access time. For example, NOR Flash memory (e.g., Microchip's SuperFlash™ ESF1, ESF3, and ESF4 cells) that are often used for high retention applications are small (e.g., 1.5 T) but typically require >7V for program/erase operations and have slow access time as compared to DRAM or SRAM memory. In advanced systems, high voltage memory devices typically increase the required die size and may be incompatible with logic rules for minimum metal pitch.

In contrast, volatile memory cells such as DRAM and SRAM, for example, are typically large and power hungry. For example, SRAM is typically fast and designed to operate at low voltage, but is physically large (typically 6 transistors (6T)) and has high power consumption.

Table 1 shows various performance and physical size characteristics for example types of memory devices, including SRAM, DRAM, and flash. As shown, volatile memory such as SRAM and DRAM are much faster, consume less energy per bit, and have a longer endurance than typical non-volatile flash memory.

TABLE 1

| Comparison of selected memory types | | | | | | |
|---|---|---|---|---|---|---|
| | Memristor | PCM | STT-RAM | DRAM | Flash | HD |
| Chip area per bit ($F^2$) | 4 | 8-16 | 14-64 | 6-8 | 4-8 | n/a |
| Energy per bit ($pJ^2$) | 0.1-3 | 2-100 | 0.1-1 | 2-4 | $10^1$-$10^4$ | $10^6$-$10^7$ |
| Read time (ns) | <10 | 20-70 | 10-30 | 10-50 | 25,000 | 5-8 × $10^6$ |
| Write time (ns) | 20-30 | 50-500 | 13-95 | 10-50 | 200,000 | 5-8 × $10^6$ |
| Retention | >10 years | <10 years | Weeks | <Second | ~10 years | ~10 years |
| Endurance (cycles) | ~$10^{12}$ | $10^7$-$10^8$ | $10^{15}$ | ~$10^{17}$ | $10^3$-$10^6$ | $10^{15}$? |
| 3D capability | Yes | No | No | No | Yes | n/a |

For some systems, there is a need for memory devices (memory cells) that operate in a low voltage domain and are compatible with advanced, high density, low energy data computational applications.

SUMMARY

Embodiments of the present invention provide memory cells having a structure generally based on flash memory cell design, but (unlike conventional flash memory) configured to operate in a low voltage domain compatible with advanced, high density, low energy data computational applications. In some embodiments or applications, these inventive memory cells may replace at least a portion of the RAM (e.g., SRAM or DRAM) included in a conventional device (e.g., a microcontroller or other computer device). Thus, the memory cells according to embodiments of the present invention are referred to herein as "RAM Flash memory cells" or "RAM Flash cells."

As used herein, "low voltage" operation refers to memory cell operations (e.g., program or erase operations) in which the voltages applied to the cell have an absolute value, or amplitude, of ≤6V. For example, in some embodiments RAM Flash cells are configured for program and erase operations using a source line voltage (Vsl), a word line voltage (Vwl), and a control gate voltage (Vcg) each having a voltage amplitude of ≤6V. As discussed below, in some embodiments RAM Flash cells are configured for program and erase operations using a source line voltage (Vsl), a word line voltage (Vwl), and a control gate voltage (Vcg) each having a voltage amplitude in the range of 3-6V, or each having a voltage amplitude in the range of 1.5-6V, or each having a voltage amplitude in the range of 2-5V, or each having a voltage amplitude in the range of 2-4V, or each at an amplitude of 3V or about 3V. All voltages listed here are in relation to ground, or other common reference potential.

As noted in the Background section above, SRAM cells are typically fast, but physically large (typically 6 transistors (6T)) with high power consumption. DRAM cells on the other hand typically use a 1T-1C (one transistor, one capacitor) architecture and are typically not compatible with a standard logic/microcontroller process flow. In addition, with DRAM cells, a continuous data refresh cycle must be performed, e.g., every 64 ms, to maintain data stored in the cells. In contrast, as discussed above, flash memory cells are typically small, e.g., 1 T or 1.5 T. Some embodiments of the present invention provide RAM Flash cells formed as modified flash memory cells configured to operate in a space typically assigned to SRAM or DRAM. For example, RAM Flash cells may be configured for low voltage (≤6V) program/erase operations to operate effectively with high density advanced logic flows at minimum or small metal pitch rules.

In some embodiments, RAM Flash cells may provide a flexible, controllable retention-hold approach to prolong data retention (as compared with traditional flash memory cells), for example to a time frame of week(s) or month(s). In some embodiments, data stored in RAM Flash cells may be restored on a periodic basis (e.g., every one or more days) from external NAND flash, HDD, or other data source.

In some embodiments, RAM Flash cells may be integrated into the same die as a microcontroller and/or CPU, which may provide (a) an advantage in bus latency (data transmission delay) over an external DRAM, and/or (b) an advantage of a much lower data refresh frequency (e.g., a refresh rate of every N days or months) as compared with conventional DRAM cells (e.g., a refresh rate of every 64 ms).

In some embodiments, the structure of a RAM Flash cell is a modified version of a conventional flash memory cell, in which at least one dielectric layer (e.g., oxide layer) has a reduced thickness as compared with the conventional flash memory cell. The reduced dielectric layer thickness may allow for low voltage program and/or erase operations, which may allow the use of an advanced low-k dielectric metal pitch with minimized or reduced leakage and reliability concerns.

In some embodiments, RAM Flash cells may have the basic structure of any known flash memory cell, e.g., a 1T flash memory cell or a split gate flash memory cell (e.g., a 1.5 T SuperFlash™ memory cell by Microchip Inc.), but with a modified structure having at least one dielectric layer with a reduced thickness. For example, in a 1T RAM Flash cell according to some embodiments, one or both of (a) the dielectric layer separating the floating gate from the underlying channel and (b) the dielectric layer between the floating gate and overlying control gate may have a reduced thickness as compared with conventional 1T flash memory cells. As another example, in a 1.5 T split-gate RAM Flash cell according to some embodiments (e.g., a 1.5 T RAM Flash cell formed as a modified SuperFlash™ memory cell), each of (a) the floating gate dielectric (e.g., oxide) separating the floating gate from the underlying channel, and/or (b) the FG-control gate inter-poly dielectric (e.g., inter-poly oxide) layer between the floating gate (sidewall) and adjacent control gate, and/or (c) the FG-wordline inter-poly dielectric (e.g., inter-poly oxide) layer between the floating gate (sidewall) and adjacent wordline may have a reduced thickness as compared with corresponding layers of conventional split-gate flash memory cells.

BRIEF DESCRIPTION OF THE DRAWINGS

Example aspects of the present disclosure are described below in conjunction with the figures, in which.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present invention provide RAM Flash cells having a structure based on a modified version of a conventional flash memory cell, but (unlike conventional flash memory) configured to operate in a low voltage (≤6V) domain. In some embodiments RAM Flash cells are formed with thinner dielectric region (e.g., oxide layers) as compared with conventional flash cells. For example, RAM Flash cells may be formed with thinner floating gate dielectric regions (e.g., floating gate oxide layers) and/or thinner inter-poly dielectric regions (e.g., inter-poly oxide layers) as compared with conventional flash memory cells, which may reduce the required voltages for program and erase operations as compared with conventional flash cells. As a result of being configured for low voltage operation, RAM Flash cells according to the present invention may be compatible with advanced, high density, low energy data computational applications, and compatible with advanced logic flows at minimum or small metal pitch rules.

In some embodiments, RAM Flash cells may be configured for improved data retention characteristics. For example, in some embodiments, data retention of RAM Flash cells can be increased (e.g., to a time frame of days, months, or years) by (a) applying a static holding voltage at selected nodes of the cell, and/or (b) refreshing/restoring data stored in RAM Flash cells on a periodic basis, e.g., from external memory (e.g., external flash memory or external DRAM).

Some embodiments provide an electronic device (e.g., computer or microcontroller) including RAM Flash cells. RAM Flash cells may replace or reduce at least a portion of the memory typically included in a conventional electronic device (e.g., conventional flash memory, SRAM, and/or DRAM), to thereby reduce the size and/or cost of the electronic device, and/or increase the performance (e.g., increased operational speed and/or battery life) of the electronic device.

Figure 1:
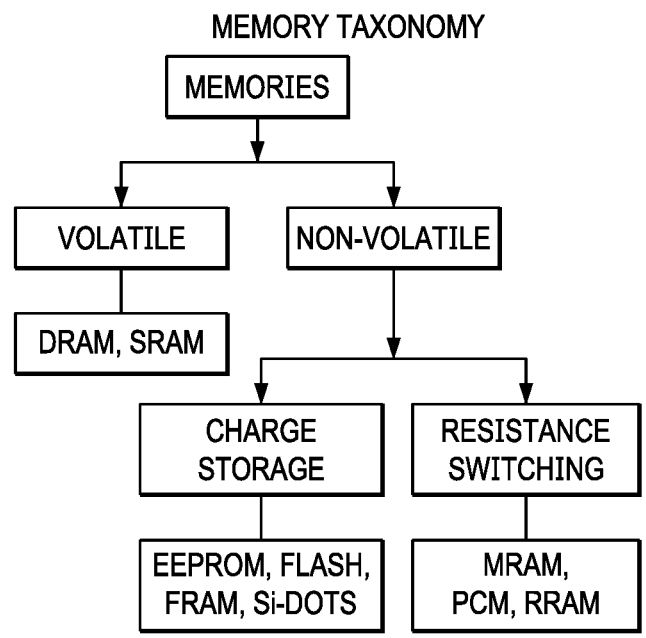
FIG. 1 shows an example taxonomy of various types of conventional volatile and non-volatile memory.
Figure 2:
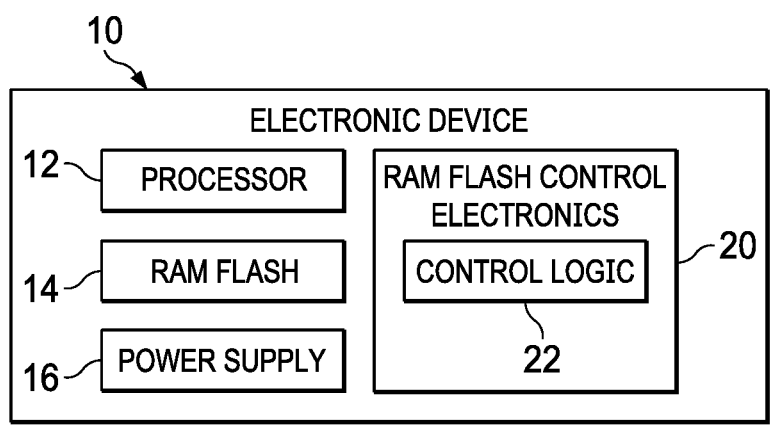
FIG. 2 illustrates an example electronic device including RAM Flash cells according to certain embodiments of the present invention.

FIG. 2 illustrates an example electronic device 10 including RAM Flash cells according to certain embodiments of the present invention. Electronic device 10 may include a processor (e.g., a microprocessor) 12, at least one RAM Flash array 14, a power supply 16, RAM Flash control electronics 20, and/or any other hardware, software, firmware, or other circuitry for providing any functionality of electronic device 10. Electronic device 10 may be a computer system (e.g., a server, desktop computer, laptop, tablet, smartphone, or any other type of computer system), a microcontroller, or any other type of electronic device that utilizes data storage. Power supply 16 may comprise at least one battery, mains power, or any other power source provided in, or external to, electronic device 10.

Each RAM Flash array 14 may include any number and type(s) of RAM Flash cells disclosed herein or otherwise consistent with the disclosed principles, including but not limited to the example 1T RAM Flash cells 50 discussed below with reference to FIG. 3 and/or the example 1.5 T split-gate RAM Flash cells 200 discussed below with reference to FIG. 5.

RAM Flash control electronics 20 may include any hardware, software, firmware, or other circuitry for controlling the operation of RAM Flash array(s) 14, including controlling voltages applied to the relevant contacts of RAM Flash cells within RAM Flash array(s) 14 to perform program, erase, and read operations on such RAM Flash cells. In some embodiments, RAM Flash control electronics 20 may include RAM Flash control logic 22, e.g., embodied as software or firmware, programmed to perform any of the functionality disclosed herein, including, for example: (a) controlling program, erase, and read operations, (b) determining and/or dynamically adjusting a holding voltage (Vh) to apply to RAM Flash cells to increase data retention (e.g., as discussed below), (c) performing and controlling data restoration or refresh operations, to further increase data retention of RAM Flash cells, as discussed below, and/or (d) any other functions of or related to RAM Flash array(s) 14. RAM Flash control electronics 20 may cooperate with processor 12, or in some embodiments, may include processor 12.

Figure 3:
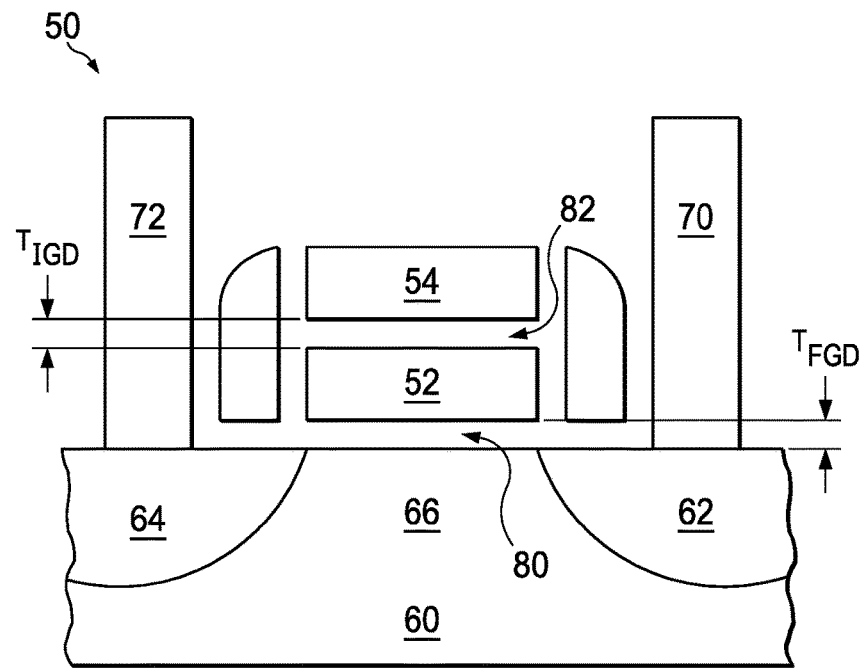
FIG. 3 illustrates an example 1T RAM Flash cell according to certain example embodiments.

FIG. 3 illustrates an example 1T RAM Flash cell 50 according to certain example embodiments. 1T RAM Flash cell 50 may include a floating gate 52 and a control gate 54 formed over a substrate 60, which may include a source region 62 and a drain region 64 separated by a channel region 66. 1T RAM Flash cell 50 may also include a source contact 70 in contact with the source region 62 and a drain contact 72 in contact with the drain region 64.

The floating gate 52 may be separated from the substrate 60, in particular the channel region 66, by a floating gate dielectric region 80, sometimes referred to as a tunneling layer or region. Further, the control gate 54 may be separated from the floating gate 52 by an inter-poly dielectric region 82, sometimes referred to as an inter-poly dielectric (IPD) layer or region. Each of the floating gate dielectric region 80 and the inter-poly dielectric region 82 may consist of a single layer or a multi-layer region (e.g., in a stacked layer arrangement). Each of the floating gate dielectric region 80 and the inter-poly dielectric region 82, or each layer within a multi-layer floating gate dielectric region 80 or a multi-layer inter-poly dielectric region 82, may comprise any suitable material(s), for example, one or more oxides e.g., thermal grown or deposited silicon dioxide, and/or one or more nitrides, e.g., silicon oxy-nitride or silicon nitride.

In some embodiments, one or both of the floating gate dielectric region 80 and the inter-poly dielectric region 82 may have a reduced thickness as compared with corresponding layers of conventional 1T flash memory cells. For example, the floating gate dielectric region 80 may have a vertical thickness, defined with substrate layer 60 as a horizontal base, $T_{FGD}$ of less than 60 Å, e.g., in the range of 25-50 Å. As another example, the inter-poly dielectric region 82 may have a vertical thickness defined with substrate layer 60 as a horizontal base, Tim of less than 60 Å, e.g., in the range of 25-50 Å. In some embodiments, the floating gate dielectric region 80 may have a vertical thickness $T_{FGD}$ of less than 60 Å, e.g., in the range of 25-50 Å and the inter-poly dielectric region 82 may have a vertical thickness Tim of less than 60 Å, e.g., in the range of 25-50 Å.

As noted above, each dielectric region 80 and 82 (e.g., oxide layers) may be thermally grown or deposited on the structure, depending on the particular embodiment. In some embodiments, the thickness of each dielectric region 80 and 82 may be controlled by selecting or adjusting parameters related to the growth or deposition of the respective region 80, 82, for example, time, temperature, and/or gas flow parameters for each respective dielectric (e.g., oxide) growth or deposition process.

In example embodiments, 1T RAM Flash cell 50 may be programmed and erased by applying defined voltages to one or more of the following: for a program operation (by hot electron injection), RAM Flash control electronics 20 may apply, e.g., 3-6V to the control gate 54, with the drain contact 72 at 3-6V and the source contact 70 at 0V for a defined time, to thereby create a cell current Ir0 that corresponds with a programmed state ("off" state) of the cell 50. For an erase operation (by Fowler-Nordheim tunneling), RAM Flash control electronics 20 may apply a negative voltage, e.g., −3 to −6V to the control gate 54 with the source contact 70 at 3-6V and the drain contact 72 is allowed to float, to thereby create a cell current Ir1 that corresponds with an erased state ("on" state) of the RAM flash cell 50. In addition, RAM Flash control electronics 20 may read the programmed/erased status of the RAM Flash cell 50 by applying a defined read voltage, e.g. 1.8V, to the control gate 54, a defined bitline voltage, e.g., 1.8V to the drain contact 72, and holding the source contact 70 at 0V.

Accordingly, Table 2 shows example voltages that may be applied to the various contacts of 1T RAM Flash cell 50 shown in FIG. 3, e.g., by RAM Flash control electronics 20 shown in FIG. 2, to perform program, erase, and read functions, according to example embodiments of the present invention.

TABLE 2

Example bias conditions for operation of 1T
RAM Flash cell 50 (FIG. 3).

| | Vcg (54) | Vsl (70) | Vd (72) |
|---|---|---|---|
| Program | 3-6 V | 0 V | 3-6 V |
| Erase | −3 to −6 V | 3-6 V | float |
| Read | 1-2 V | 0 V | 1-2 V |

The example voltages of 3-6V for program and erase operations of the 1T RAM Flash cell 50 compare favorably with required voltages in the 10-15V range for a conventional 1T flash memory cell. Thus, 1T RAM Flash cell 50 according to the present invention may substantially reduce the required operational voltages, as compared with conventional flash memory cells.

Figure 4:
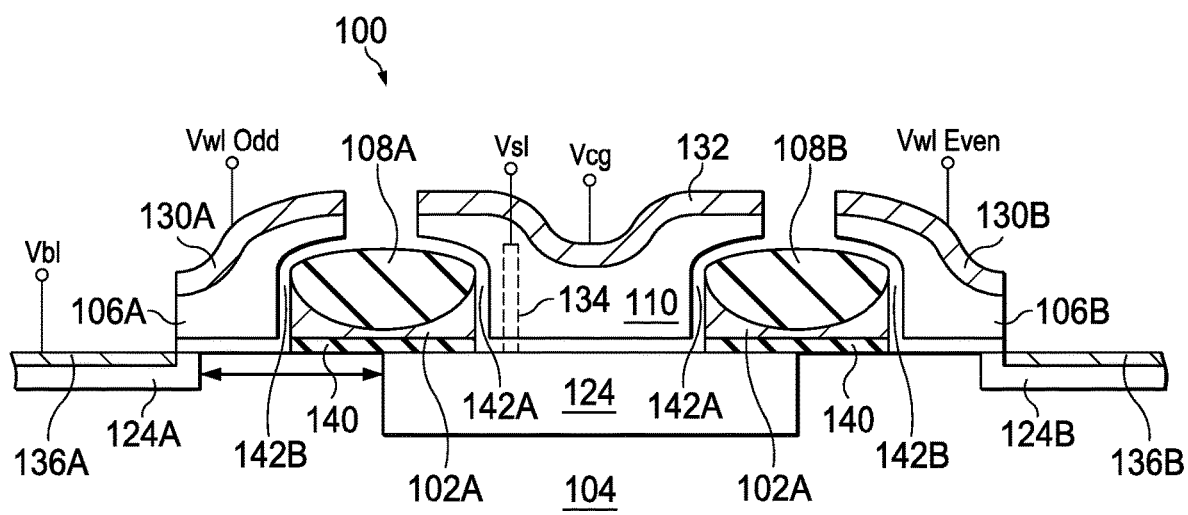
FIG. 4 illustrates an example known split-gate flash memory cell, namely a SuperFlash™ (ESF1+) memory cell.

FIG. 4 illustrates side cross-sectional view of a known 1.5 T split-gate flash memory cell 100. The example split-gate flash memory cell 100 may be a SuperFlash™ memory cell (e.g., a SuperFlash™ ESF1+ cell) available from Microchip Technology Inc., Chandler, Ariz.

Flash memory cell 100 includes a pair of floating gates 102A and 102B formed over a substrate 104, word line terminals 106A and 106B extending over floating gates 102A and 102B, respectively, and a control gate 110 extending over both floating gates 102A and 102B. An oxide region 108A, 108B is respectively formed over each floating gate 102A, 102B. Word line terminals 106A and 106B may couple, for example, to an odd row word line and an even row word line 106B. A doped source region or junction 124 may be formed in substrate 104 below the control gate 110 and extending partially below each floating gate 102A and 102B, and a pair of doped bit line regions or junctions 124A and 124B may be formed in substrate 104 respectively adjacent word line terminals 106A and 106B.

Split-gate flash memory cell 100 may also include electrically conductive contact regions in contact with word line terminals 106A and 106B, control gate 110, source region 124, and bit line regions 124A and 124B, for applying voltages to the various cell components to provide various memory cell functions, e.g., program, erase, and read functions. As shown, these contacts may include word line contacts 130A and 130B coupled to word line voltages Vwl Odd and Vwl even, respectively, a control gate contact 132 coupled to control gate voltage Vcg, a source contact 134, and respective bit line contacts 136A and 136B. The source contact 134 may be located into or out of the page relative to the illustrated cross-section, e.g., at a location of a break in the control gate 110.

Each floating gate 102A, 102B is spaced apart from the underlying channel region 124 by a floating gate oxide layer 140. In addition, each floating gate 102A, 102B is spaced apart from the shared control gate 110 by an inter-poly oxide region 142A, and each floating gate 102A, 102B is spaced apart from a respective wordline terminal 106A, 106B by an inter-poly oxide region 142B.

Floating gate oxide layer 140 and inter-poly oxide regions 142A and 142B are formed with thicknesses that allow for the conventional operation of the split-gate flash memory cell 100 (e.g., SuperFlash™ memory cell) as a non-volatile, high-voltage cell. For example, each floating gate oxide layer 140 may have a thickness of about 100 Å, while each inter-poly oxide region 142A and 142B may each have a thickness of about 130 Å.

Split-gate flash memory cell 100 may be programmed and erased by applying defined voltages to one or more of the following: a selected word line contact 130A or 130B (coupled respectively to word line voltages $V_{WL}$ Odd and $V_{WL}$ Even, the control gate contact 132 (coupled to control gate voltage $V_{CG}$), the source contact 134 (coupled to source line voltage $V_{SL}$), and/or a selected bit line contact 136A or 136B (coupled to bit line voltages $V_{BL}$) for a defined time to provide either (a) a cell current IR0 that corresponds with a programmed state ("off" state) of the cell or (b) a cell current Ir1 that corresponds with an erased state ("on" state) of the cell. In addition, the programmed/erased status of the cell may be read by applying defined voltages to a selected word line contact 130A or 130B ($V_{WL}$) and the adjacent bit line contact 136A or 136B ($V_{BL}$).

Table 3 shows example voltages that may be applied to the various contacts of the split-gate flash memory cell 100 shown in FIG. 4 to perform program, erase, and read functions, according to a conventional cell operation. As shown, a read function is performed via the word line 106A or 106B and associated bit line 124A or 124B, by applying a defined $V_{WL}$ and $V_{BL}$ to a selected word line contact 130A or 130B and associated bit line contact 136A or 136B, with no voltage applied to the source contact 134 ($V_{SL}$=0) or control gate contact 132 ($V_{CG}$=0).

TABLE 3

Example bias conditions for operation of conventional
split-gate flash memory cell.

| | Vwl | Vsl | Vbl | Vcg |
|---|---|---|---|---|
| Program | 1.5 V | 9-15 V | ~0.6 V | 9-15 V |
| Erase | 9-15 V | 0 V | 0 V | −9 V to −15 V |
| Read | 1.8 V | 0 V | 1.8 V | 0 V |

Figure 5:
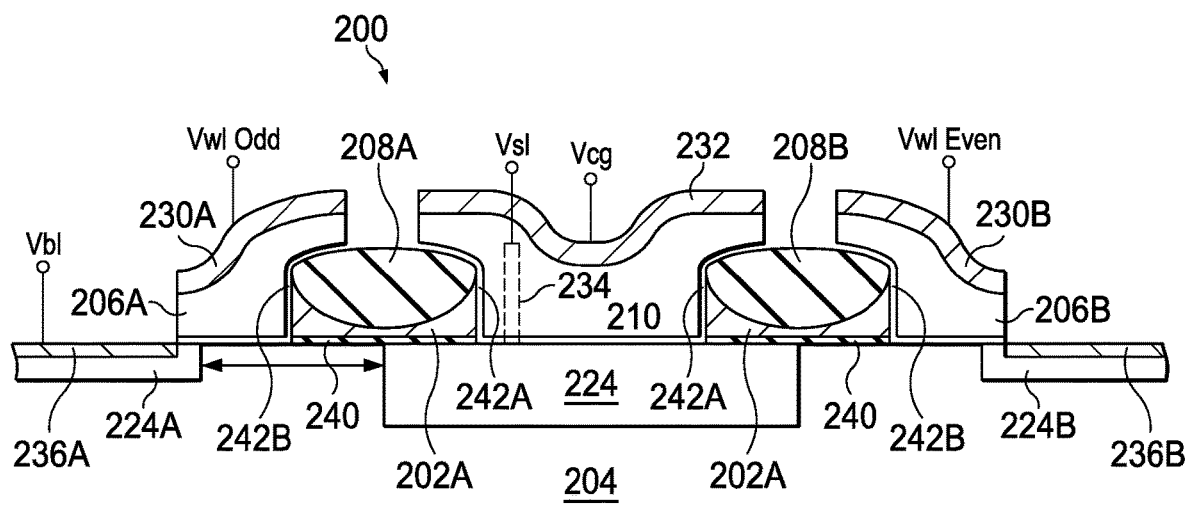
FIG. 5 illustrates an example split-gate flash memory cell configured as a RAM Flash cell, according to one example embodiment of the invention.

FIG. 5 illustrates an example 1.5 T split-gate RAM Flash cell 200 (e.g., a modified SuperFlash™ memory cell) according to example embodiments of the present invention. Split-gate RAM Flash memory cell 200 includes a pair of floating gates 202A and 202B formed over a substrate 204, word line terminals 206A and 206B extending over floating gates 202A and 202B, respectively, and a control gate 210 extending over both floating gates 202A and 202B. An oxide region 208A, 208B is respectively formed over each floating gate 202A, 202B. Word line terminals 206A and 206B may couple, for example, to an odd row word line and an even row word line. A doped source region or junction 224 may be formed in substrate 204 below the control gate 210 and extending partially below each floating gate 202A and 202B, and a pair of doped bit line regions or junctions 224A and 224B may be formed in substrate 204 respectively adjacent word line terminals 206A and 206B.

Split-gate RAM Flash cell 200 may also include electrically conductive contact regions in contact with word line terminals 206A and 206B, control gate 210, source region 224, and bit line regions 224A and 224B, for applying voltages to the various cell components to provide various memory cell functions, e.g., program, erase, and read functions. As shown, these contacts may include word line contacts 230A and 230B coupled to word line voltages Vwl Odd and Vwl even, respectively, a control gate contact 232 coupled to control gate voltage Vcg, a source contact 234, and respective bit line contacts 236A and 236B. The source contact 234 may be located into or out of the page relative to the illustrated cross-section, e.g., at a location of a break in the control gate 210.

Each floating gate 202A, 202B is spaced apart from the underlaying channel region 224 by a floating gate dielectric region (e.g., floating gate oxide layer) 240. In addition, each floating gate 202A, 202B is spaced apart from the shared control gate 210 by an inter-poly dielectric region 242A, and spaced apart from a respective wordline terminal 206A, 206B by an inter-poly dielectric region 242B.

In some embodiments, floating gate dielectric region 240 and inter-poly dielectric regions 242A and/or 242B are formed with respective thicknesses that allow split-gate RAM Flash cell 200 to be operated (e.g., including program, erase, and read functions) in a low voltage (≤6V) domain compatible with advanced, high density, low energy data computational applications. In some embodiments, one, some, or all floating gate dielectric region 240 and inter-poly dielectric regions 242A and/or 242B have a reduced thickness as compared with respective dielectric layers/regions of conventional split-gate flash memory cells (e.g. oxide layers/regions 140, 142A, and 142B of the conventional split-gate flash memory cell 100 shown in FIG. 4). For example, the respective floating gate dielectric region 240 between each floating gate 202A, 202B and the underlying channel region 124 may have a thickness of less than 80 Å, or less than 60 Å e.g., in the range of 40-60 Å. As another example, the respective inter-poly dielectric region 242A between each floating gate 202A, 202B and the respective word line terminal 206A, 206B and between the shared control gate 210 may have a thickness of less than 100 Å, or less than 50 Å, e.g., in the range of 25-50 Å. As another example, the respective inter-poly dielectric region 242B between each floating gate 202A, 202B and its adjacent wordline terminal 206A, 206B may have a thickness of less than 100 Å, or less than 50 Å, e.g., in the range of 25-50 Å. In some embodiments, (a) each floating gate dielectric region 240 has a thickness of less than 80 Å, or less than 60 Å e.g., in the range of 40-60 Å, and (b) each inter-poly dielectric region 242A and 242B has a thickness of less than 100 Å, or less than 50 Å, e.g., in the range of 25-50 Å.

Each dielectric region (e.g., oxide layer or region), including floating gate dielectric region 240, inter-poly dielectric region 242A, and/or inter-poly dielectric region 242B, may be thermally grown or deposited on the structure, depending on the particular embodiment. In some embodiments, the thickness of each dielectric region 240, 242A, and 242B may be controlled by selecting or adjusting parameters related to the growth or deposition of the respective region 240, 242A, 242B, for example, time, temperature, and/or gas flow parameters for each respective dielectric (e.g., oxide) growth or deposition process.

Split-gate flash memory cell 200 may be programmed and erased, e.g., by RAM Flash control electronics 20 shown in FIG. 2, by applying defined voltages for a defined time to one or more of the following: a selected word line contact 230A or 230B (coupled respectively to word line voltages $V_{WL}$Odd and $V_{WL}$ Even), the control gate contact 232 (coupled to control gate voltage $V_{CG}$), the source contact 234 (coupled to source line voltage $V_{SL}$), and/or a selected bit line contact 236A or 236B (coupled to bit line voltages $V_{BL}$), to thereby provide either (a) a cell current Ir0 corresponding with a programmed state ("off" state) of the cell or (b) a cell current Ir1 corresponding with an erased state ("on" state) of the cell. In addition, the programmed/erased status of the cell may be read by applying defined voltages to a selected word line contact 230A or 230B ($V_{WL}$) and adjacent bit line contact 236A or 236B ($V_{BL}$).

Due to the reduced thickness of dielectric regions 240, 242A, and/or 242B (as compared with conventional flash memory cells), program and erase functions on the RAM Flash cell 200 may be performed using lower voltages than conventional flash memory cells, such as split-gate flash memory cell 100. For example, in some implementations of RAM Flash cell 200: (a) programming is performed by source-side hot electron injection; thus, a reduced thickness of the floating gate dielectric region (e.g., floating gate oxide layer) 240 creates a higher field; and (b) erase is performed through Fowler-Nordheim tunneling between an upper tip of floating gate 202A, 202B and the adjacent wordline 206A, 206B; thus, a reduced thickness of the respective inter-poly oxide region 242B creates a higher field. Further, low voltage (≤6V) program or erase operations may allow for advanced low-k dielectric metal pitch to be used without leakage and reliability concerns.

For a respective RAM flash cell, the thickness of dielectric regions 240, 242A, and 242B, the voltages applied during erase and program voltages, and data retention of the cell are all interrelated to each other. For example, decreasing the thickness of dielectric regions 240, 242A, and 242B may allow for lower-voltage program and erase functions, but may reduce the data retention of the cell, and vice versa. As another example, for a cell with particular dielectric region thicknesses, reducing the operational voltages for program and erase functions generally reduces the data retention of the cell, and vice versa. Thus, for any particular RAM flash cell or array of RAM flash cells, the various factors discussed above (e.g., dielectric region thicknesses, program and erase voltages, and data retention) may be selected or tuned to provide the desired functionality of the cell(s), e.g., depending on the particular application, device, or product in which the cell(s) are provided.

Tables 4A-4D below show example voltages that may be applied to the various contacts of the example RAM Flash cell 200 shown in FIG. 5, e.g., by RAM Flash control electronics 20 shown in FIG. 2, for performing program, erase, and read functions, according to four example embodiments. The example embodiments of Tables 4A-4D may correspond with cells having selected thicknesses of dielectric regions 240, 242A, and 242B, for desired data retention characteristics of the respective cells. As shown, a read function is performed via the word line 206A or 206B and associated bit line 224A or 224B, by applying a defined $V_{WL}$ and $V_{BL}$ to a selected word line contact 230A or 230B and associated bit line contact 236A or 236B, with no voltage applied to the source contact 234 ($V_{SL}$=0) or control gate contact 232 ($V_{CG}$=0).

TABLE 4A

Example bias conditions for operation of split-gate RAM Flash cell 200 (FIG. 5), example embodiment A.

|  | Vwl | Vsl | Vbl | Vcg |
| --- | --- | --- | --- | --- |
| Program | 1.5 V | 1.5-6.0 V | ~0.6 V | 1.5-6.0 V |
| Erase | 1.5-6.0 V | 0 V | 0 V | −1.5 V to −6.0 V |
| Read | 1.8 V | 0 V | 1.8 V | 0 V |

TABLE 4B

Example bias conditions for operation of split-gate RAM Flash cell 200 (FIG. 5), example embodiment B.

|  | Vwl | Vsl | Vbl | Vcg |
| --- | --- | --- | --- | --- |
| Program | 1.5 V | 2.0-5.0 V | ~0.6 V | 2.0-5.0 V |
| Erase | 2.0-5.0 V | 0 V | 0 V | −2.0 V to −5.0 V |
| Read | 1.8 V | 0 V | 1.8 V | 0 V |

TABLE 4C

Example bias conditions for operation of split-gate RAM
Flash cell 200 (FIG. 5), example embodiment C.

|  | Vwl | Vsl | Vbl | Vcg |
|---|---|---|---|---|
| Program | 1.5 V | 2.0-4.0 V | ~0.6 V | 2.0-4.0 V |
| Erase | 2.0-4.0 V | 0 V | 0 V | −2.0 V to −4.0 V |
| Read | 1.8 V | 0 V | 1.8 V | 0 V |

TABLE 4D

Example bias conditions for operation of split-gate RAM
Flash cell 200 (FIG. 5), example embodiment D.

|  | Vwl | Vsl | Vbl | Vcg |
|---|---|---|---|---|
| Program | 1.5 V | 3.0 V | ~0.6 V | 3.0 V |
| Erase | 3.0 V | 0 V | 0 V | −3.0 V |
| Read | 1.8 V | 0 V | 1.8 V | 0 V |

In some embodiments, RAM Flash control electronics 20 may select the voltages or range of voltages to apply for effective program and erase operations in the cell 200 based at least on the thickness of floating gate dielectric region 240 and inter-poly dielectric regions 242A and/or 242B, e.g., wherein the applied voltages can be decreased for decreased dielectric thicknesses. As shown by comparison of Tables 4A-4D (example operation of the split-gate RAM Flash cell 200) with Table 3 (example operation of conventional split-gate flash memory cell 100, the example split-gate RAM Flash cell 200 shown in FIG. 5 allows for significantly lower program and erase voltages than the conventional split-gate flash memory cell 100.

In addition to the inventive structure of RAM Flash cells that allows for low voltage operation, another aspect of the invention provides methods of operating RAM Flash cells (e.g., example 1T RAM Flash cell 50 or example split-gate RAM Flash cell 200 described above) to improve retention characteristics in a customizable and/or dynamically controllable or tunable manner based on critical paths for retention loss. As discussed below, in some embodiments, data retention of RAM Flash cells can be increased (e.g., to a time frame of days, months, or years) by (a) applying a static holding voltage at selected nodes of the cell, and/or (b) refreshing/restoring data stored in RAM Flash cells on a periodic basis, e.g., from external memory (e.g., external flash memory or external DRAM).

Table 5 shows one example method for increasing the storage retention of the example split-gate RAM Flash cell 200 shown in FIG. 5, according to one example embodiment. As shown in Table 5, suitable control electronics, e.g., RAM Flash control electronics 20 shown in FIG. 2, may apply a non-zero static holding voltage Vh to the word line terminals 206A, 206B and control gate (CG) 210 to lower the field across the dielectrics regions surrounding the floating gate (FG) 202A, 202B, and thereby improve retention. In some embodiments, a low static current is drawn under such hold condition, which may create a low field across the floating gate oxide to the adjacent poly region (e.g., poly2 region). Table 5 shows example bias conditions for applying a static holding voltage Vh to RAM Flash cell 200.

TABLE 5

Example bias conditions for improved retention for
split-gate RAM Flash (FIG. 5).

|  | Vwl | Vsl | Vbl | Vcg |
|---|---|---|---|---|
| Static hold | Vh | 0 V | 0 V | Vh |

Figure 6:
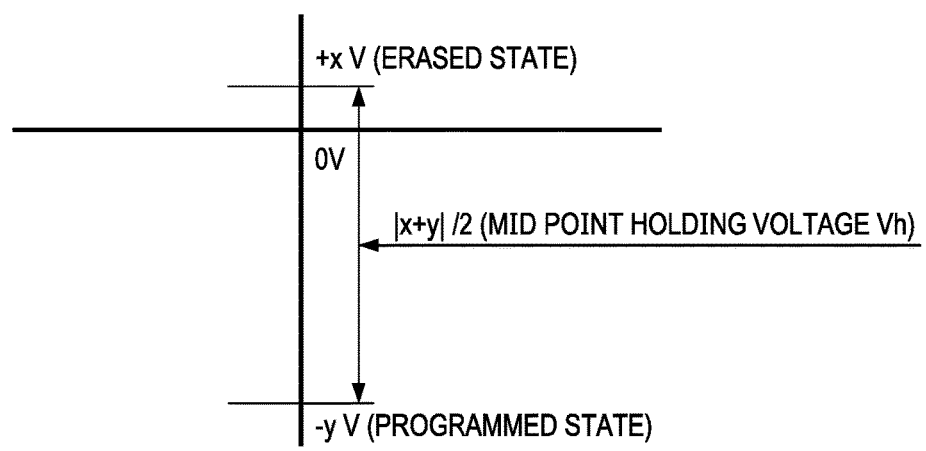
FIG. 6 is a graph illustrating an example technique for determining a holding voltage to apply to the example split-gate RAM Flash cell shown in FIG. 5, according to one example embodiment of the invention.

In some embodiments, RAM Flash control electronics 20 may be configured to select and/or dynamically adjust (or "tune") the holding voltage Vh, for example, based on particular cell operation and/or performance characteristics determined or monitored over time. FIG. 6 is a graph illustrating one example method for selecting a holding voltage Vh based on the performance of an example RAM Flash cell, according to example embodiments. In the example shown in FIG. 6, the voltage threshold of the cell during an erased state is +x V, while the voltage threshold of the cell in the programmed state is −y V, which voltages may be measured by any suitable electronics (e.g., provided on the same microcontroller or computer as the RAM Flash cell) and averaged over a number of cycles, for example. In some embodiments, a holding voltage Vh to be applied to the RAM Flash cell may be determined as a mathematical function of the erase state voltage threshold (+x V) and program state voltage threshold (−y V). For example, the holding voltage Vh may be selected as the midpoint between the erase state voltage threshold (+x V) and program state voltage threshold (−y V), which may be expressed as |x+y|/2 as shown in FIG. 6, and which may be referred to as the "erased state/programmed state midpoint voltage."

In some embodiments, the retention charge loss of a RAM Flash cell or group of RAM Flash cells in a given state (erased state and/or programmed state) can be characterized at the time of manufacture, either during a product testing or product characterization process, and the weaker state (program or erase) can be compensated for by applying an appropriate holding voltage Vh. For example, if it is determined for a particular RAM Flash cell that the erase state retention charge loss is dominant (as compared with the program state retention charge loss), RAM Flash control electronics 20 may apply a positive Vh (e.g., using a value determined as described above) on all nodes surrounding the floating gate. Conversely, RAM Flash control electronics 20 may apply a negative Vh to enhance retention in the programmed state, e.g., for a RAM Flash cell in which the programmed state retention charge loss is dominant.

In addition, for RAM Flash cells in which the erase state retention charge loss is dominant, RAM Flash control electronics 20 may also apply a positive voltage to the source line (e.g., in addition to the holding voltage Vh applied to the word line (WL) and control gate (CG)) to further improve data retention in the cells. The positive voltage applied to the source line may be the same, less than, or greater than the holding voltage Vh, depending on the particular implementation.

In some embodiments, the erased state voltage and/or programmed state voltage of a RAM Flash cell may change over time (e.g., after N program/erase cycles), and thus RAM Flash control electronics 20 may recalculate and dynamically adjust the holding voltage Vh accordingly, e.g., by recalculating and dynamically adjusting the erased state/programmed state midpoint voltage on at a defined recurring frequency.

In some embodiments, RAM Flash cells may experience significantly less variability than certain conventional memory cells, e.g., filament-based resistive RAM, due to larger variability inherent in a filament formation process as compared with the dielectric storage-based RAM Flash cells. Thus, in some embodiments, tight control of manufacturing and operating variables may enable RAM Flash control electronics 20 to apply a common holding voltage Vh for an array of RAM Flash cells, rather than applying a different holding voltage Vh to different cells within an array. In addition, the holding mode may allow a lower current draw compared with resistive memories, thus permitting low overall power draw in a dense application.

In some embodiments, RAM Flash control electronics 20 may be configured to further increase data storage retention in RAM Flash cells by implementing a controlled data restoration/refresh protocol. The expected retention for a RAM Flash cell as disclosed herein may be days to months, depending on the particular RAM Flash cell structure, applied voltages, and the process used for forming the relevant dielectric layers (e.g., the specific processes used to form the floating gate dielectric region(s) and/or inter-poly dielectric region(s)). In some embodiments, RAM Flash control electronics 20 may be programmed to restore data stored in RAM Flash cells on a periodic basis (e.g., after every N hours or days) from external data storage (e.g., from DRAM, NAND, or HDD external to the relevant RAM Flash array) to further increase the data retention of the RAM Flash cells, e.g., to a retention period of years. RAM Flash control electronics 20 may be programmed to perform a data refresh on a RAM Flash cell or group of RAM Flash cells, for example, by first reading the contents of the RAM Flash cell(s) to other memory (e.g., SRAM, DRAM, or other flash memory) and then re-erasing or re-programming each RAM Flash cell.

In some embodiments, RAM Flash configured for extended data retention (e.g., by applying a holding voltage Vh and/or by implementing a data refresh protocol, e.g., as discussed above) can be used in applications requiring extended data retention and a low data refresh rate, e.g., as compared with conventional DRAM (which typically requires a refresh frequency of 64 ms) or other conventional memory cells. The reduced refresh rate may extend battery life for the respective electronic device 10 (e.g., computer or microcontroller).

Further, as discussed above, in some embodiments, RAM Flash data retention can be extended by providing a holding voltage Vh at selected nodes, e.g., at the word line (WL) and control gate (CG) electrodes in a split-gate RAM Flash cell. In some embodiments, a value of the holding voltage Vh can be determined and/or dynamically tuned as a function of retention loss characteristics of each respective RAM Flash cell or RAM Flash array, such as whether the RAM Flash cell(s) exhibit greater retention charge loss in the erase state or the programmed state.

The concepts disclosed herein can be applied to any suitable types of flash memory cells, by forming RAM Flash cells having a modified structure of various types of conventional flash memory cells (e.g., by reducing the thickness of floating gate dielectric region(s) and/or inter-poly dielectric region(s) of such flash memory cells), including single-transistor (1T) flash memory cells and multiple-transistor flash memory cells (e.g., 1.5 T split-gate flash cells), including for example a range of NOR flash memory cells such as SuperFlash™ ESF1, ESF2, ESF3, or ESF4 cells covering a wide range of process geometries.

Figure 7:
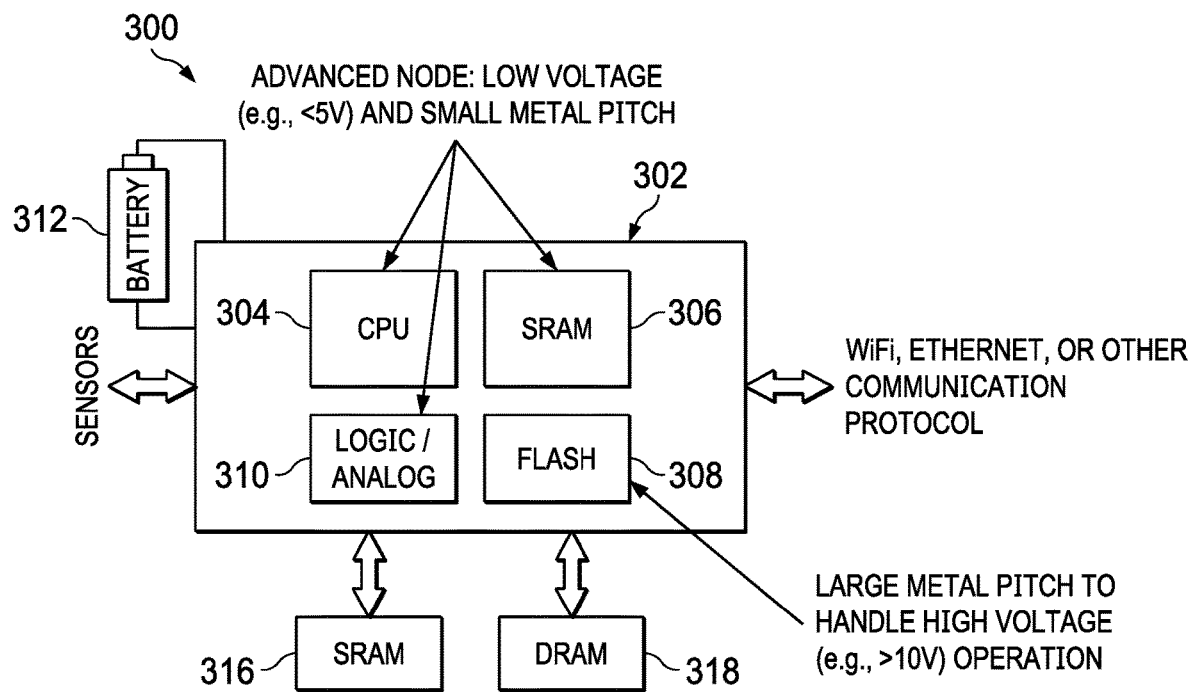
FIG. 7 illustrates an example of a conventional controller (e.g., microcontroller)
Figure 8:
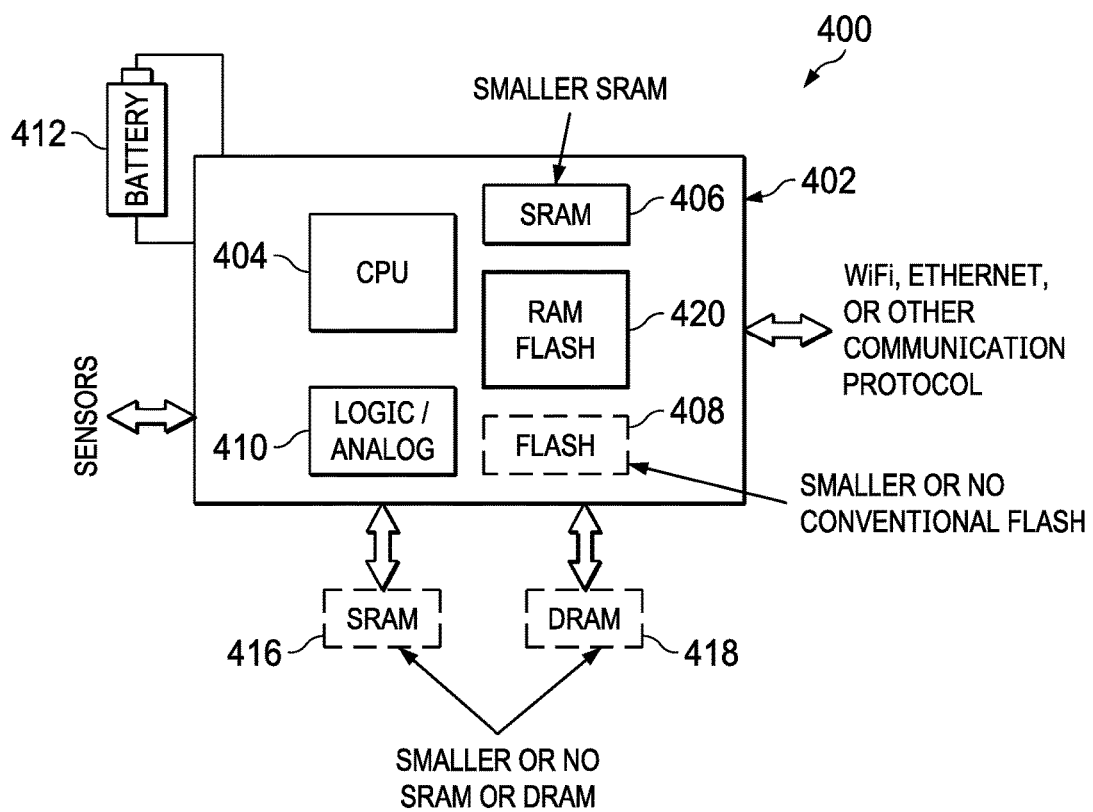
FIG. 8 illustrates an example controller including RAM Flash cells, according to one example embodiment of the invention.

As mentioned above, RAM Flash cells as disclosed herein may be configured for low voltage (≤6V) program/erase operations. Thus, RAM Flash cells may be compatible with high density advanced logic flows at minimum or small metal pitch rules. FIGS. 7 and 8 illustrate a comparison between an example of a conventional microcontroller (e.g., a controller for an Internet of things (IOT) application) using conventional memory devices (FIG. 7), and a corresponding controller incorporating RAM Flash memory according to the present invention (FIG. 8), which may reduce or replace SRAM, DRAM, and/or conventional flash memory needed in the conventional controller.

The example conventional controller 300 shown in FIG. 7 includes a chip 302 including a CPU 304, SRAM 306, conventional flash memory 308, logic/analog devices 310, and/or other various electronics. The chip 302 is powered by a battery 312, and interfaces with SRAM 316, DRAM 318, external sensor(s), and communication protocols (e.g., WiFi, Ethernet, etc.). The flash memory 308 is a high retention memory (typically >10 years) and requires high voltage (e.g., >10V) for program/erase operations, and executes such program/erase operations at low speed. As shown in FIG. 7, for advanced node applications, the CPU 304, SRAM 306, and logic/analog devices 310 on chip 302 may be low voltage devices and thus compatible with small metal pitch structure, while the flash memory 308 requires a much larger metal pitch due to the high voltage (>10 V) operational requirements.

In contrast, the example controller 400 shown in FIG. 8, according to one example embodiment of the present invention, includes a chip 402 including a CPU 404, SRAM 406, RAM Flash memory 420, conventional flash memory (optional) 408, logic/analog devices 410, and/or other various electronics. The chip 402 may be powered by a battery 412, and may interface with external sensor(s) and communication protocols (e.g., WiFi, Ethernet, etc.) as with the conventional chip 302, and may (optionally) interface with external SRAM 416 and/or DRAM 418. As shown, the inclusion of the RAM Flash 420 on chip 402 may reduce or eliminate the need for one or more other types of memory in the controller 400, as compared with a conventional controller, e.g., controller 300 discussed above. For example, the RAM Flash 420 may (a) allow the on-chip SRAM 406 to be reduced, (b) allow the on-chip conventional flash memory 408 to be reduced or eliminated, and/or (c) allow the external SRAM 416 and/or DRAM 418 to be reduced or eliminated. The RAM Flash 420 may utilize chip footprint space typically used by SRAM or DRAM in a conventional controller, may use less power and space (because flash memory is smaller than SRAM, for example), and with increased speed, because the operational speed is defined by the RAM Flash access time instead of obtaining data from external DRAM as in the conventional controller 300. Also, because the RAM Flash 420 is configured to low voltage operation, it may be produced with small metal pitch, e.g. pitch used by the chip CPU 404, SRAM 406, and logic/analog devices 408, thus reducing the required footprint on the chip 402.

The invention claimed is:
1. A system, comprising:
   a memory cell configured for low-voltage operation, the memory cell comprising:
   a floating gate formed over a channel region;
   a first dielectric region formed between the floating gate and the channel region;
   a control gate formed over or adjacent the floating gate; and
   a second dielectric region formed between the floating gate and the control gate;

wherein a thickness of at least one of the first dielectric region and the second dielectric region is selected to allow low voltage program operations and erase operations on the memory cell; and
data retention control electronics configured to increase data retention of the memory cell by at least one of:
(a) applying a holding voltage to at least one node on the memory cell; or
(b) periodically refreshing a storage state of the memory cell.

2. The system of claim 1, wherein the memory cell comprises a single transistor (1T) flash memory cell structure.

3. The system of claim 1, wherein the memory cell comprises a split-gate flash memory cell structure.

4. The system of claim 1, wherein the memory cell comprises a modified version of a SUPERFLASH memory cell.

5. The system of claim 1, wherein the thickness of the first dielectric region formed between the floating gate and the channel region is less than 80 Å.

6. The system of claim 1, wherein the thickness of the second dielectric region formed between the floating gate and the control gate is less than 100 Å.

7. The system of claim 1, further comprising operations control electronics configured to perform program operations and erase operations on the memory cell by applying a voltage (≤6V) to respective nodes of the flash memory cell.

8. The system of claim 1, wherein the data retention control electronics are configured to select and/or dynamically adjust the holding voltage as a function of at least one measured performance characteristic of the memory cell.

9. The system of claim 1, wherein the data retention control electronics are configured to periodically refresh the storage state of the memory cell at a frequency of at least one day.

10. The system of claim 1, wherein the memory cell is configured to replace SRAM or DRAM in the system.

11. The system of claim 1, wherein the thickness of the at least one of the first dielectric region and the second dielectric region is selected to allow program operations and erase operations using voltages having an amplitude of ≤6V.

12. The system of claim 1, wherein:
the memory cell further includes a word line and a source line; and
the system further comprises operations control electronics coupled to the memory cell and configured to perform at least one of program operations or erase operations on the memory cell by applying word line voltages at the word line, source line voltages at the source line, and control gate voltages at the control gate, wherein the applied word line voltages, source line voltages, and control gates voltages have amplitudes of ≤6V.

13. The system of claim 12, wherein the operations control electronics are configured to perform at least one of program operations or erase operations on the memory cell by applying word line voltages, source line voltages, and control gates voltages with amplitudes in the range of 1.5V-6V.

14. The system of claim 12, wherein the operations control electronics are configured to perform at least one of program operations or erase operations on the memory cell by applying word line voltages, source line voltages, and control gates voltages with amplitudes in the range of 2V-5V.

15. The system of claim 1, wherein:
the memory cell further includes a source region and a drain region; and
the system further comprises operations control electronics coupled to the memory cell and configured to perform at least one of program operations or erase operations on the memory cell by applying source voltages at the source region, drain voltages at the drain region, and control gate voltages at the control gate, wherein the applied source voltages, drain voltages, and control gates voltages have amplitudes of ≤6V.

16. The system of claim 15, wherein the operations control electronics are configured to perform at least one of program operations or erase operations on the memory cell by applying source voltages, drain voltages, and control gates voltages with amplitudes in the range of 3V-6V.

17. A method of operating a memory cell configured for low-voltage operation and including a floating gate formed over a channel region, a first dielectric layer formed between the floating gate and the channel region and having a thickness of less than 80 Å, a control gate formed over or adjacent the floating gate, and a second dielectric layer formed between the floating gate and the control gate and having a thickness of less than 100 Å, the method comprising:
performing an erase operation on the memory cell by applying a set of voltages to the flash memory cell, including:
a source line voltage in the range of 3-6V;
a control gate voltage in the range of −3V to −6V; and
wherein the drain is allowed to float.

18. A method of operating a memory cell configured for low-voltage operation and including a floating gate formed over a channel region, a first dielectric layer formed between the floating gate and the channel region and having a thickness of less than 80 Å, a control gate formed over or adjacent the floating gate, and a second dielectric layer formed between the floating gate and the control gate and having a thickness of less than 100 Å, the method comprising:
performing a program operation on the memory cell by applying a set of voltages to the memory cell, including:
a source line voltage having an amplitude of ≤6V;
a control gate voltage in the range of 3-6V; and
a drain voltage in the range of 3-6V.

19. A method of operating a memory cell configured for low-voltage operation and including a floating gate formed over a channel region, a first dielectric layer formed between the floating gate and the channel region and having a thickness of less than 80 Å, a control gate formed over or adjacent the floating gate, and a second dielectric layer formed between the floating gate and the control gate and having a thickness of less than 100 Å, the method comprising:
performing an erase operation on the memory cell by applying a set of voltages to the memory cell, including:
a source line voltage having an amplitude of ≤6V;
a word line voltage in the range of 1.5-6.0V; and
a control gate voltage in the range of −1.5V to −1.5V.

20. A method of operating a memory cell configured for low-voltage operation and including a floating gate formed over a channel region, a first dielectric layer formed between the floating gate and the channel region and having a thickness of less than 80 Å, a control gate formed over or adjacent the floating gate, and a second dielectric layer formed between the floating gate and the control gate and having a thickness of less than 100 Å, the method comprising:
- performing a program operation on the memory cell by applying a set of voltages to the memory cell, including:
  - a source line voltage in the range of 1.5-6.0V; and
  - a control gate voltage in the range of 1.5-6.0V.

* * * * *